United States Patent [19]

Tailliet

[11] Patent Number: 5,608,335
[45] Date of Patent: Mar. 4, 1997

[54] METHOD FOR THE TESTING OF INTEGRATED CIRCUIT CHIPS AND CORRESPONDING INTEGRATED CIRCUIT DEVICE

[75] Inventor: François Tailliet, Epinay sur Seine, France

[73] Assignee: SGS-Thomson Microelectronics, S.A., Gentilly Cedex, France

[21] Appl. No.: 173,176

[22] Filed: Dec. 27, 1993

[30] Foreign Application Priority Data

Dec. 31, 1992 [FR] France .................................... 92 15997

[51] Int. Cl.$^6$ .................................................. G01R 31/02
[52] U.S. Cl. ............................................ 324/763; 324/754
[58] Field of Search .................................... 324/763, 537, 324/158.1, 512, 754; 371/22.4

[56] References Cited

U.S. PATENT DOCUMENTS

| | | | |
|---|---|---|---|
| 4,038,648 | 7/1977 | Chesley | 340/173 R |
| 4,281,449 | 8/1981 | Ports et al. | 29/593 |
| 4,426,773 | 1/1984 | Hargis . | |
| 4,467,400 | 8/1984 | Stopper | 361/45 |
| 4,635,261 | 1/1987 | Anderson et al. | 371/25 |
| 4,764,728 | 8/1988 | Sato et al. | 324/512 |
| 4,956,602 | 9/1990 | Parrish | 324/537 |
| 4,961,053 | 10/1990 | Krug | 324/537 |
| 5,008,614 | 4/1991 | Shreeve et al. | 324/754 |
| 5,012,187 | 4/1991 | Littlebury | 324/754 |
| 5,038,101 | 8/1991 | Murphy | 324/755 |
| 5,121,053 | 6/1992 | Shreeve et al. | 324/754 |
| 5,126,657 | 6/1992 | Nelson | 324/761 |
| 5,315,241 | 5/1994 | Ewers | 324/158.1 |
| 5,457,400 | 10/1995 | Ahmad et al. | 324/763 |

FOREIGN PATENT DOCUMENTS

| | | |
|---|---|---|
| 2203977 | 8/1973 | France . |
| 8802549 | 9/1987 | WIPO . |

OTHER PUBLICATIONS

Int'l Test Conf 1987 Proceedings, Integration of Test with Design & Manufacturing, "Multiplexed Test Structures for IC Process Evaluation", pp. 451–457, Trombley et al. (month unavailable).

Proc. IEEE 1990 Int. Conf on Microelectronic Test Structures, vol. 3, Mar. 1990, "A Novel Approach for Reducing the Area Occupied by Contact Pads on Process Control Chips", pp. 75–80, Walton et al.

Primary Examiner—Ernest F. Karlsen
Assistant Examiner—Russell M. Kobert
Attorney, Agent, or Firm—Robert Groover; Betty Formby

[57] ABSTRACT

In a method for the testing of integrated circuits on wafers, the testing is facilitated by setting apart a test circuit zone on the wafer. The test circuit zone comprises contact pads to which it is possible to apply the tips of a tester, and also comprises a demultiplexer to transmit test stimuli to one out of N buses at the output of the demultiplexer. The output buses of the demultiplexer extend between the rows of chips on the wafer. Column selection conductors extend between the columns of chips. The demultiplexer and a decoder, both controlled directly by the tester, enable the selection of one chip at a time for testing. The testing tips are not shifted from one chip to the next one. The wafer is then sliced into individual chips.

14 Claims, 3 Drawing Sheets

स5,608,335

METHOD FOR THE TESTING OF INTEGRATED CIRCUIT CHIPS AND CORRESPONDING INTEGRATED CIRCUIT DEVICE

BACKGROUND OF THE INVENTION

1. Field of the Invention

The invention relates to the making of integrated circuits and it is aimed at proposing an original testing method as well as an integrated circuit wafer structure that can be used to implement this test.

Integrated circuit chips, which normally have sides measuring some millimeters, are made in batches on semiconductor wafers with diameters ranging from several centimeters to several tens of centimeters. Several tens, hundreds or thousands of chips are therefore manufactured together on one and the same wafer, and the wafer is sliced into individual chips at the end of manufacture. Then these chips are put into appropriate protective packages.

2. Description of the Prior Art

An essential stage of the manufacture is the testing, on a wafer, of all the chips. This test enables the defective chips to be rejected before they are encapsulated. This makes it possible to avoid adding to manufacturing costs by the unnecessary and costly encapsulation of defective chips.

The testing on wafer is done by means of a testing apparatus provided with a set of extremely fine tips that are applied to the input/output pads of each chip. These pads are the contact pads which will be used subsequently to enable the chip to communicate with the exterior.

The testing apparatus is therefore designed for the application, with precision, of the testing tips to the contact pads of a chip, the testing of this chip, the marking of the chip if it is defective, the shifting of the tips to the next chip, the carrying out of the test, etc.

This procedure is a lengthy one since it is repeated as many times as there are chips. In general, if the chip is a simple one, the test procedure may be simple, but there will be very many chips (e.g. several thousands of them) per wafer. And if the chip is a complex one there are fewer chips (e.g. several hundreds of them) per wafer, but the testing procedure for each chip is lengthier. In both cases, the time taken to test a wafer may be very long, so that the test becomes the main factor in the cost of the integrated circuits. The testing apparatus is very costly and the greater the time taken to test the wafers, the greater is the number of testing machines that will be required for a batch production of integrated circuits.

It is possible to conceive of a method for testing all the chips of a wafer in parallel since the procedures to be carried out on each chip are identical. However this would imply the need to make a machine having a number of testing tips that is equal to the product of the number of chips by the number of contact pads of each chip. For example, for a wafer with 1000 chips having 8 contacts each, there would have to be 8000 testing tips for the machine instead of 8 tips. The machine would be so costly that the financial advantage procured by the reduction in water-testing time would be entirely lost. Furthermore, it would be difficult to separate the signals sent back by the different chips in response to the signal sent by the testing apparatus, so that it would be difficult to identify the defective chips.

This is why, according to the invention, another approach is proposed to the testing of wafers.

SUMMARY OF THE INVENTION

According to the invention, there is proposed a method for the testing of integrated circuits on an entire wafer, before the wafer is sliced into individual chips, wherein testing tips of a testing apparatus are applied to contact pads located in a test circuit zone outside the chips to be tested, these contact pads being connected to control inputs and to test signal inputs of a demultiplexer, also located in the test circuit zone, groups of outputs of the demultiplexer being connected to respective buses going from the demultiplexer to the chips, to enable communication between a chip or a group of specified chips and the testing apparatus, as a function of chip selection signals applied by the testing apparatus to the control inputs of the demultiplexer.

The invention therefore also proposes an integrated circuit wafer designed to be sliced into a plurality of individual chips, comprising to this effect main zones each comprising a respective integrated circuit that will form a respective chip after the slicing of the wafer, the main zones being separated from one another by slicing zones along which the slicing between individual chips will be done, said wafer comprising a demultiplexer and contact pads located in a test circuit zone located outside the main zones, the demultiplexer having signal inputs and control inputs connected to the contact pads and having outputs connected to buses of conductors that pass along the slicing zones between chips and that may be connected to the integrated circuits of the main zones.

Preferably, to avoid the need for a number of buses equal to the number of chips, which would form a very dense network between the rows and columns of chips, it is provided that there will be as many output buses as there are rows of chips in the wafer. There is also provision for a local connector, in the vicinity of each chip, between the chip and the bus that goes beside it, and there is provision for column conductors passing between the columns of chips, each column conductor enabling simultaneous control over all the local conductors corresponding to the chips of this column. The column conductors are connected to the outputs of a column decoder having its inputs connected to contact pads of the test circuit zone, in such a way that a specific column conductor may be selected by the testing machine.

It is thus possible to make a selection, through the apparatus, of both a row bus (through selection by the demultiplexer) and a column conductor (through selection by the decoder), in order to test a specific chip located at the intersection of this row and this column.

It will be seen that, in this approach to the testing on wafer according to the invention, it is possible to attempt the performance, in parallel on all the chips, of certain tasks that can be carried out simultaneously while at the same time preserving a successive processing of the tasks that can only be carried out chip by chip. Thus, a notable reduction of the total testing time and hence of the resulting cost is achieved, and this is done without the need for a testing apparatus that is very expensive or impossible to make.

The demultiplexer acts as a demultiplexer for the sending of testing stimuli to a chip, but it also acts as a multiplexer to collect responses to these stimuli from this chip.

The integrated circuits of the main zones are provided with contact pads that will subsequently be used for the connection of the chip with the exterior. Preferably, the buses coming from the demultiplexer are connected to these contact pads by means of the local connector placed in the vicinity of each chip.

BRIEF DESCRIPTION OF THE DRAWINGS

Other features and advantages of the invention will appear from the following detailed description, made with reference to the appended drawings, of which.

MORE DETAILED DESCRIPTION

Figure 1:
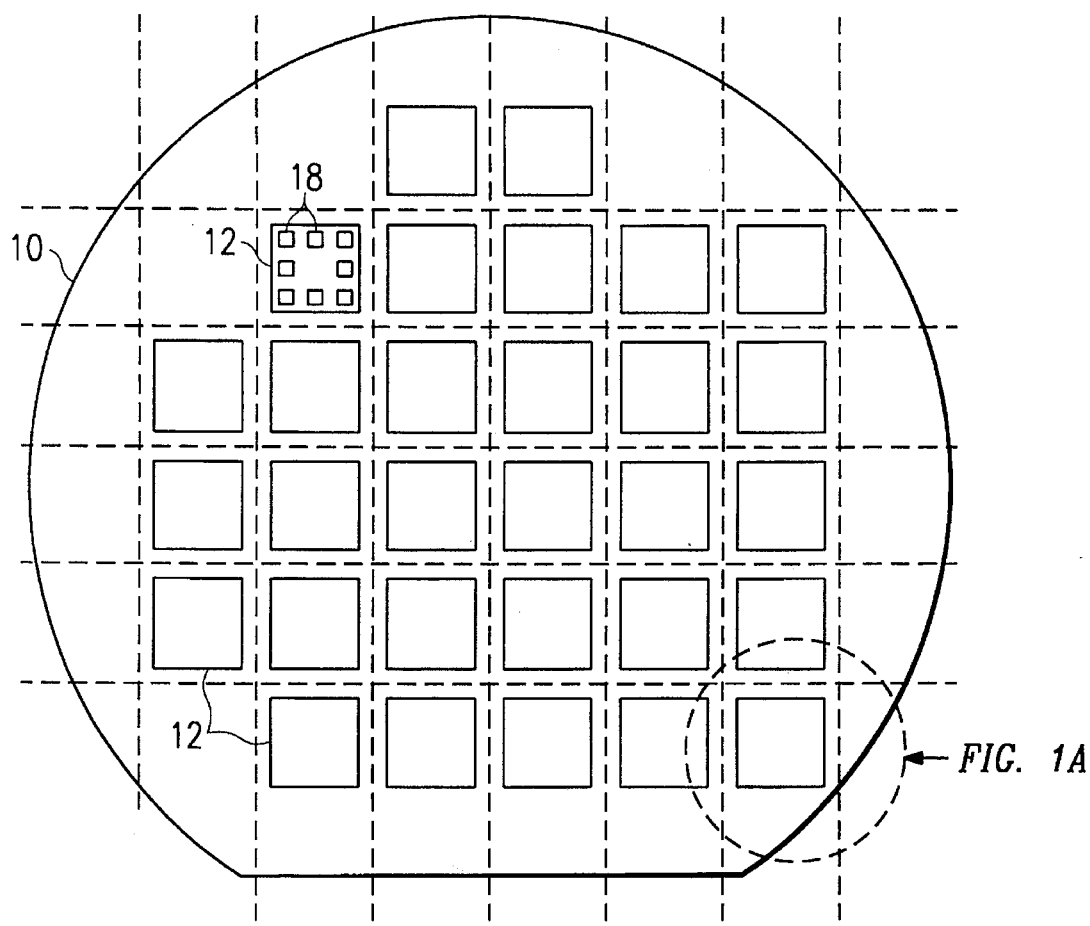
FIG. 1 shows an integrated circuit wafer comprising a large number of chips.
Figure 1A:
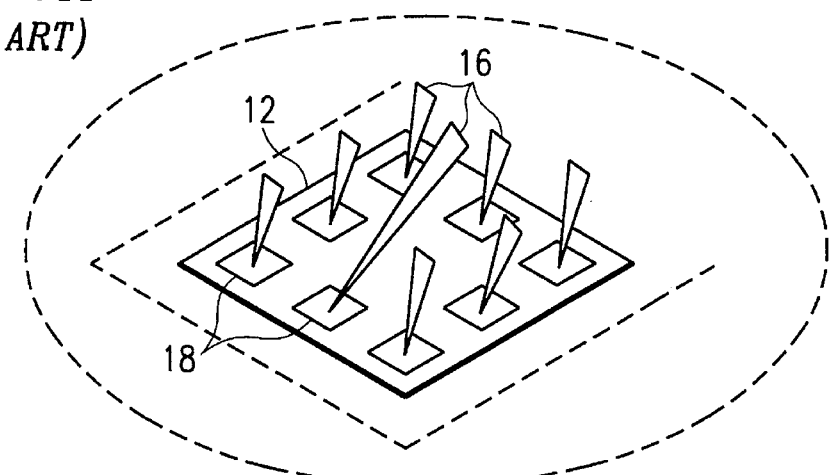

FIG. 1 shows a standard integrated circuit wafer 10 on which there have been made a large number of identical integrated circuits 12 arranged in a network of rows and columns of circuits. The wafer is designed to be sliced along horizontal and vertical lines (represented by dashes) extending between the rows and columns of circuits; this slicing or cutting-out operation separates the circuits from one another into individual rectangular chips, each comprising a respective integrated circuit.

The integrated circuits are tested individually before being sliced into chips in an operation called "testing on wafer" as opposed to the testing of the circuit in a package.

The test is the same for all the chips. For example, for a memory, the test consists in applying address signals and data signals to be recorded and then in reading the data elements that have actually been recorded.

The test is carried out by a tester that consists of a mechanical part and an electrical part.

The mechanical part has:

a movable table X-Y with micrometrical feed, carrying the wafer 10 to be tested;

a system of tips 16 that can rest simultaneously on the different contact pads 18 of a chip;

a system of precise alignment to position the tips on a chip and to shift the table X-Y step by step so as to go to another chip belonging to a neighboring row or column when the testing of the first chip is finished;

an inking system to mark the tested chip if it proves to be defective.

The electrical part of the tester comprises the system for steering the table X-Y and a computer that sends the test sequences to the chips through the testing tips and analyzes the received signals returning from the tested circuit.

Figure 2:
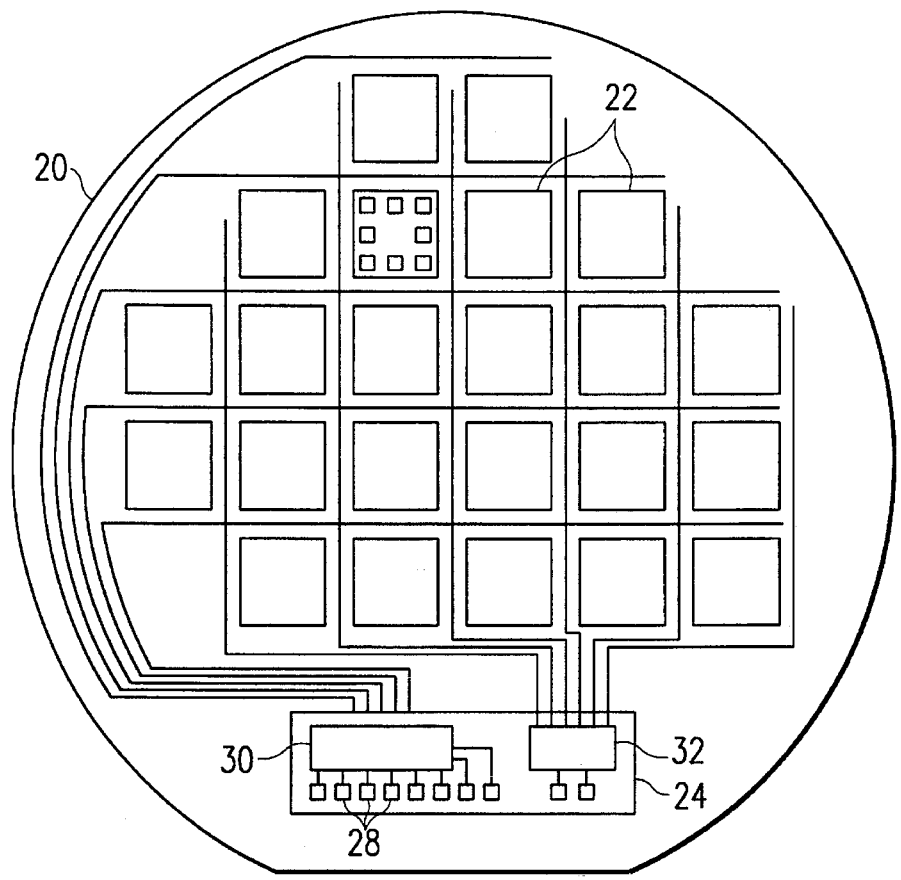
FIG. 2 gives a schematic view of the general organization of a wafer according to the invention.

FIG. 2 shows a schematic view of a wafer 20 according to the invention: there is a network of N rows and M columns of integrated circuits 22 as in FIG. 1; the wafer is designed to be subsequently sliced into individual chips each comprising a respective circuit 22.

A specific zone 24 of the wafer, outside the circuits 22, comprises an integrated circuit used solely for the testing.

In its simplest version, this specific test circuit comprises:

contact pads 28 that are used only during the test, and to which the tips of the testing apparatus can be applied, and a demultiplexer 30 having signal inputs and control inputs connected to the contact pads, and outputs connected to a large number of buses, each having several conductors.

The buses start from the outputs of the demultiplexer and extend along the lines for the future cutting out of the chip (the horizontal and vertical lines shown in FIG. 1) to pass along all the chips that are to be tested. The buses are used to obtain access individually to each chip as a function of the commands applied to the demultiplexer 30 by the testing apparatus. There could be one bus per chip but, should the chips be very numerous, it is preferred to have, for example, one bus for an entire rank of chips and as many buses as there are ranks, the selection of a chip from a rank being done by another means. This means may be a column decoder 32 having addressing inputs connected to pads 28 and outputs that are connected to column conductors extending between the columns of chips to select one column of chips from among the others.

The testing apparatus, which is connected by tips to the pads 28, will therefore be able to control the demultiplexer 30 and the decoder 32 to select a single chip, apply test signals to it by means of a bus that enables the chip to be connected to the demultiplexer and collect the return signals, by means of this bus, to send them to the testing machine.

It is then possible to test each chip successively without having to shift the testing tips mechanically.

In addition, however, this configuration of the testing system enables the test to be further accelerated for it enables certain test operations to be made parallel when these operations can be carried out simultaneously on the different chips.

A simple example can be given by way of an illustration in the case of chips comprising an electrically erasable, programmable memory. The basic procedure of the test can be divided into three steps.

A. Protocol for the sending of an address and a data element; duration 0.3 milliseconds;

B. Programming cycle: a writing automaton makes a recording, in the memory, at the received address, of the data element received; duration: about 10 milliseconds increased by 15 milliseconds to take account of the fact that the duration is not the same for all the chips;

C. Protocol for the reading of the data element at the address indicated: 0.4 ms.

The task A should be carried out successively, chip by chip, since the addresses and the data elements have to be sent by the buses whereas the bus enables access to only one chip at a time. It is possible, however, to conceive of certain cases where the buses would enable access to all the chips simultaneously for this task and where the task would then be carried out in parallel.

The task B can be carried out in parallel for all the chips together, for it is carried out by an automaton internal to each chip. For each chip, the task B can start as soon as the task A is completed for this chip (but without waiting for it to be completed for the other chips).

The task C must necessarily be carried out chip by chip, for it must be possible to distinguish the data elements read in the different chips after the writing operation. The task C can start for a chip after the end of the task B of this chip but on condition, however, that all the tasks A are completed for it is not possible to send a data element to be written by the tester while a read data element is sent back to the tester.

In all, in this example, the total testing time for X chips varies between:

$T1 = X \cdot 0.3$ ms $+ 15$ ms $+ 0.4$ ms (the favorable case where all the tasks A are completed while the task B of the first chip is not completed) and $T2 = X \cdot 0.3$ ms $+ X \cdot 0.4$ ms (the adverse case where the task C of the first chip has to be delayed until all the tasks A are completed).

For a number of chips equal to 5000 (which is a standard figure for small circuits with eight contact pads on a wafer with a diameter of about 15 cm), the total testing time is 3.5 seconds in this example. With a standard test using tips, carried out chip by chip, the testing time would be X.(0.3+ 0.4+15) ms=1 minute, 18 seconds.

If the test procedure comprises 20 steps for the writing and reading of data, the standard testing time is 26 minutes; with the invention, it is 1 min.10 sec.

It should be possible to connect any chip, at any time, to the testing tips by means of the demultiplexer and the buses that go out from this demultiplexer.

A description shall be given, with reference to an example, of how this connection is made.

It is assumed that the unsliced wafer has a network of chips with N=100 parallel ranks of M=50 chips each at the maximum (the wafer is round and certain ranks or columns may be incomplete). It is assumed that the chips have P=8 external contacts, which is the case with chips for memory cards having a credit card format.

Figure 3:
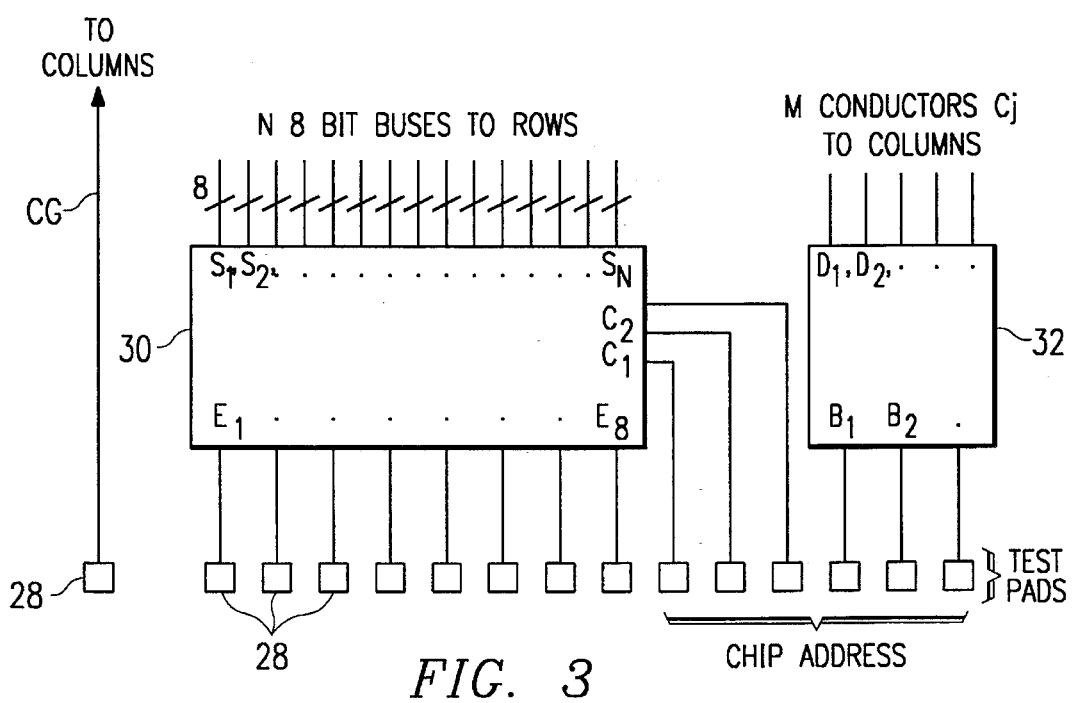
FIG. 3 gives a schematic view of the test circuit zone set apart on the wafer for the test operations.

In FIG. 3, it is seen that the demultiplexer 30 preferably has eight inputs/outputs E1 to E8 of signals to be demultiplexed, i.e. in principle, as many inputs/outputs of signals as there are contact pads on the chips to be tested. These signal inputs may include the supply voltages Vcc and Vss to be applied to the chips, the clock signals etc. The buses could comprise a number of conductors that is smaller than the number of contact pads of the chips should it be the case that not all the pads are necessary for the test. The signal inputs to be demultiplexed are each connected to a respective contact pad 28 of the test circuit zone 24.

The demultiplexer 30 has as many groups S1, S2,... SN as there are rows of chips. For example, there are N=100 groups of outputs connected respectively to N=100 buses of conductors. And each group of outputs comprises P=8 outputs, each bus having 8 wires. These buses go out from the demultiplexer and extend between the rows of chips in going along the chips of each row, along the lines for the subsequent slicing of the wafer.

The demultiplexer 30 also comprises control inputs C1, C2, . . . , the number of which is sufficient to enable the working of the demultiplexer to be controlled and especially to enable the giving of a command for the selection of one out of N buses. These inputs are connected to contact pads 28 of the zone 24 and, from the testing apparatus, they receive notably a row address of the chip to be tested. Through these inputs, the testing machine can therefore select one out of N output buses to connect it to the inputs/outputs E1 to E8, i.e. to connect it to the testing apparatus.

The column decoder 32 also has control inputs B1, B2, . . . connected to contact pads 28, the number of which is sufficient to enable the selection of one out of M=50 columns possible, and it has a number of outputs D1, D2, . . . equal to the number M of columns. These outputs are connected to conductors, each of which passes along a respective vertical line for the slicing of the wafer, to extend along a respective column of chips.

Each of these output conductors of the column decoder make it possible to control the link between the chips of this column and the buses that pass in the vicinity of these chips.

For reasons that shall be explained further below, there is also provision for a general command for the application of a voltage Vcc to all the chips at the same time. This command is transmitted by the testing apparatus, for example from a pad 28 of the test circuit zone. This pad is connected to a general control conductor CG that is divided into M column conductors enabling checks on the application of the supply Vcc to the chips independently of whether the state of the buses is active or passive.

Figure 4:
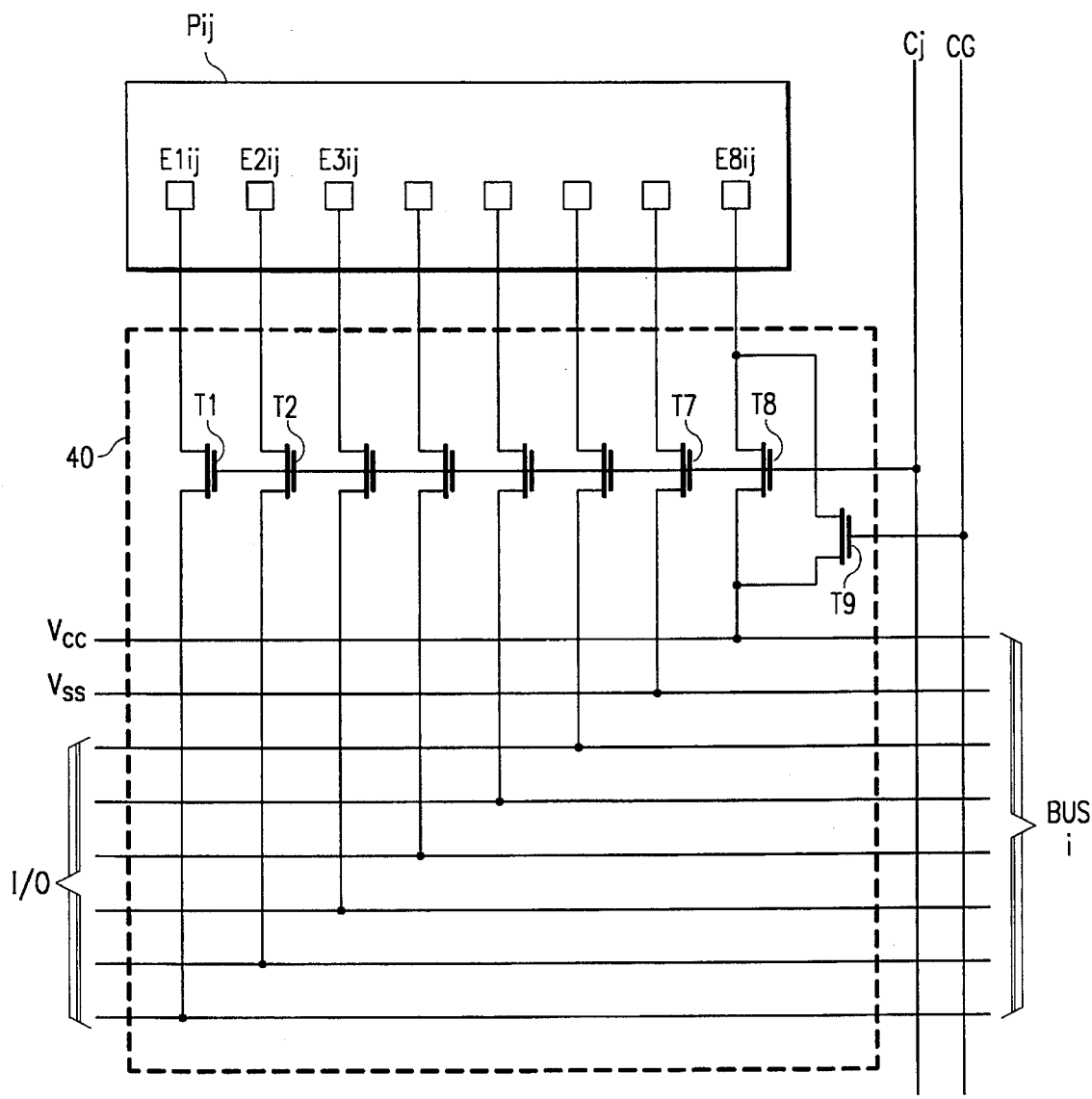
FIG. 4 shows the local connection between a test bus and a chip to be tested.

FIG. 4 shows the local connection between a chip and a bus going through a slicing zone in the vicinity of this chip.

A connection circuit 40 is provided locally in the vicinity of each chip (it could even form part of the chip). This circuit is controlled chiefly by the column conductor Cj coming from the decoder 32 and corresponding to the column j. The conductor Cj controls the link between the bus BUSi corresponding to the rank i and a chip Pij located at the intersection of the rank i and the column j. More specifically, the conductor Cj controls the link between the different conductors of the BUSi and each of the contact pads E1ij, E2ij, . . . E8ij, of the chip. Eight transistors T1 to T8 controlled by the conductor Cj have been shown to indicate this local connection between the chip and the bus. The transistor T7 which enables the connection to Vss may be replaced by a short-circuit if it is accepted that Vss should be applied systematically to all the chips or at least to all the chips of a same column.

All the chips of the column j are connected to the respective buses that pass beside them. But only one bus is active, i.e. selected by the demultiplexer. The others are at high impedance (except for the conductors Vcc and Vss of the buses). Only one chip is thus selected to be tested.

A ninth transistor T9 has been shown for the separate control (independently of TS) of the connection between the pad ESij (pad designed to receive the supply Vcc) and the eighth conductor of the bus, i.e. the one that conveys Vcc. This transistor T9 is controlled by the conductor CG.

The result thereof is that there are two ways of supplying the chip:

either the conductor CG is inactive; only the chip Pij connected to the bus BUSi selected by the demultiplexer 30 and connected to this bus by the corresponding column conductor Cj will be supplied;

or the conductor CG is active, and then all the chips of the rank selected by the demultiplexer are supplied; it can also be planned that all the chips of the wafer will be supplied but then, with the circuit shown in FIG. 4, this implies that Vcc is sent systematically by all the buses (even those not selected) when CG is active.

This additional command for the supply of the chips by the bus CG makes it possible notably to carry out, at the same time for all the chips, the tasks that can be carried out in parallel and that do not require the application, to the chips, of any signals other than supply signals.

In the example of a memory test given here above, the carrying out of the programming (task B) can be made parallel, and this task will be performed by using the command CG.

The defective chips can be located by their row and column address. They may be marked by inking after the end of the test. They may also be marked at the time of the detection of a defect, but in this case they are preferably marked by electrical means such as the application of an electrical fusing voltage to fuses positioned on the surface of the chip. These fuses are positioned in such a way that the optical appearance of the chip is changed by the fusing to an extent that is sufficient for the chip to be identified as a defective chip, solely by the fact of the change in its appearance (which can be detected by a human operator or by an appropriate optical detector). A network of fuses taking up a large surface area of the chip may be adequate. It is then necessary to provide for a command from the testing apparatus to blow out these fuses. An additional conductor in the test buses may be necessary.

When the wafer is sliced into individual chips, the local connectors 40 will not longer come into play.

For the practical making of the specific test circuits, it is possible to provide for a manufacture of the integrated circuit by a standard technique, the conductors of the buses and the other column conductors being formed by the same level of metallization used to make the contact pads of the chips.

In the integrated circuits wherein it is provided that the chip will be entirely surrounded by a protection barrier against the infiltration of moisture, the best course will be to interrupt this barrier locally to let through connecting conductors between the chip and the connector 40. The interruption in the barrier could be in the form of a baffle so as to cause the least possible deterioration in the efficiency of the barrier. However, it is also possible to provide for a case where the links between the chip and the local connector will be set up by an additional level of metallization, by means of technologies that then no longer need to be highly precise: for example, a deposit and an etching of conductive polymer may enable the making of these connections which are used only at the time of the test. The conductive polymer is then eliminated before the slicing of the wafer.

What is claimed is:

1. A method for the testing of integrated circuits on an entire wafer, before the wafer is sliced into individual chips, comprising the steps of:

applying testing tips of a testing apparatus to contact pads located in a test circuit zone which is on said wafer but outside the chips to be tested, said contact pads being connected to control inputs and to test signal inputs of a demultiplexer, also located in the test circuit zone, said demultiplexer providing groups of outputs which are connected to respective buses going from the demultiplexer to the chips, to enable communication between a group of specified chips and the testing apparatus, as a function of chip selection signals applied by the testing apparatus to the control inputs of the demultiplexer, and wherein the testing apparatus applies testing signals successively to respective ones of said specified chips, and wherein certain test sequences are carried out in parallel for multiple ones of said chips simultaneously.

2. The method of claim 1, wherein said integrated circuits all have identical circuit designs.

3. An integrated circuit wafer designed to be sliced into a plurality of individual chips comprising, to this effect, main zones each comprising a respective integrated circuit that will form a respective chip after the slicing of the wafer, said main zones being separated from one another by slicing zones along which the slicing between individual chips will be done;

said wafer comprising a demultiplexer and contact pads located in a test circuit zone located outside the main zones, said demultiplexer having signal inputs and control inputs connected to the contact pads and having outputs connected to buses of conductors that pass along the slicing zones between chips and that may be connected to the integrated circuits of the main zones, and means for the simultaneous application, to all of said chips, of a supply voltage, even if they are selected neither by the demultiplexer nor by any other selection logic.

4. An integrated circuit wafer according to claim 3, comprising multiple rows of chips, multiple buses of conductors passing along said rows, a plurality of respective local connectors to connect a specific chip to a bus that passes beside this chip, column conductors passing between columns of chips, each said column conductor enabling the control, simultaneously, of all the connectors corresponding to the chips of this column, and a column decoder having inputs connected to contact pads of the test circuit zone and outputs connected to the column conductors.

5. An integrated circuit wafer according to claim 4, wherein said local connector is connected to contact pads of the chip with which it is associated.

6. The wafer of claim 2, wherein said integrated circuits all have identical circuit designs.

7. A method for testing nonvolatile memory chips in an unseparated wafer, comprising the steps of:

(a) sending data and address bits to each of said chips, sequentially;

(b) performing write operations on all functioning ones of said chips at an address sent to said chips, simultaneously; and (c) reading test data from each of said chips, sequentially;

wherein said steps (a) and (c) are performed using decode logic on said wafer, which is not part of any of said nonvolatile memory chips.

8. The method of claim 7, wherein said integrated circuits all have identical circuit designs.

9. A method for testing nonvolatile memory chips in an unseparated wafer, comprising the steps of:

(a) sending data and address bits to all of said chips simultaneously;

(b) performing write operations on all functioning ones of said chips at an address sent to said chips, simultaneously; and (c) reading test data from each of said chips, sequentially;

wherein said steps (a) and (c) are performed using decode logic on said wafer, which is not part of any of said nonvolatile memory chips.

10. The method of claim 9, wherein said integrated circuits all have identical circuit designs.

11. An integrated circuit wafer, comprising:

a plurality of integrated circuits in a regular array of rows and columns on the wafer, each said integrated circuit including, within an area bounded by slice lines, electronic circuitry connected to multiple contact pads within said slice lines;

demultiplexing circuitry on the wafer and outside of said integrated circuits, and respective probe contact locations integrated with said demultiplexing circuitry;

multiple interconnect lines extending, on said wafer outside said integrated circuits, from said demultiplexing circuitry to respective ones of said integrated circuits;

wherein said demultiplexing circuitry is configured to provide selectable serial or parallel access, from said probe contact locations, through ones of said multiple interconnect lines, to said integrated circuits.

12. The wafer of claim 11, wherein said integrated circuits all have identical circuit designs.

13. An integrated circuit wafer, comprising:

a plurality of integrated circuits in a regular array of rows and columns on the wafer, each said integrated circuit including, within an area bounded by slice lines, electronic circuitry connected to multiple contact pads;

demultiplexing circuitry on the wafer, and respective probe contact locations integrated with said demultiplexing circuitry;

a first plurality of thin-film interconnect lines extending, on said wafer outside said integrated circuits, from said demultiplexing circuitry along ones of said columns of integrated circuits, to respective ones of said integrated circuits;

a second plurality of thin-film interconnect lines extending, on said wafer outside said integrated circuits, from said demultiplexing circuitry along ones of said rows of integrated circuits, to respective ones of said integrated circuits; and respective select logic portions adjacent to ones of said integrated circuits, and configured to permit serial or parallel access to a respective one of said integrated circuits from at least one line of said first plurality of interconnect lines when a respective line of said second plurality of interconnect lines is driven active;

whereby said demultiplexing circuitry provides selectable access, from said probe contact locations, through said first and second interconnect lines, to said integrated circuits.

14. The wafer of claim 13, wherein said integrated circuits all have identical circuit designs.

* * * * *